(12) United States Patent
Spiro

(10) Patent No.: US 11,284,528 B2
(45) Date of Patent: Mar. 22, 2022

(54) WIREPORT ASSEMBLY

(71) Applicant: Daniel S. Spiro, Paradise Valley, AZ (US)

(72) Inventor: Daniel S. Spiro, Paradise Valley, AZ (US)

(73) Assignee: LIGHTING DEFENSE GROUP, LLC, Scottsdale, AZ (US)

( * ) Notice: Subject to any disclaimer, the term of this patent is extended or adjusted under 35 U.S.C. 154(b) by 0 days.

(21) Appl. No.: 16/900,406

(22) Filed: Jun. 12, 2020

(65) Prior Publication Data

US 2020/0337166 A1    Oct. 22, 2020

Related U.S. Application Data

(60) Continuation-in-part of application No. 16/191,937, filed on Nov. 15, 2018, now Pat. No. 10,716,229,
(Continued)

(51) Int. Cl.
*B05B 15/62*    (2018.01)
*F21S 4/10*    (2016.01)
(Continued)

(52) U.S. Cl.
CPC ........... *H05K 5/0256* (2013.01); *B05B 15/62* (2018.02); *F21S 4/10* (2016.01); *F21S 8/068* (2013.01); *F21V 23/001* (2013.01); *G05B 15/02* (2013.01); *G06N 5/02* (2013.01); *H01R 13/73* (2013.01); *H01R 33/05* (2013.01); *H01R 33/88* (2013.01);
(Continued)

(58) Field of Classification Search
CPC .... B05B 15/62; B05B 9/04; F21S 4/10; F21S 8/068; F21S 8/06; F21V 23/001; F21V 23/00; G05B 15/02; G06N 5/02; G06N 5/04; G08G 1/0116; G08G 1/04; G08G 1/095; H01R 13/005; H01R 13/73;
(Continued)

(56) References Cited

U.S. PATENT DOCUMENTS 5,205,091 A    4/1993  Brown
9,513,648 B2  12/2016  Forbes, Jr.
(Continued)

FOREIGN PATENT DOCUMENTS

CN    204720148    10/2015
CN    105407547    3/2016
(Continued)

OTHER PUBLICATIONS

Ravichandran, S., Intelligent Public Lighting System, International Science Press, 2016, pp. 201-204.
(Continued)

*Primary Examiner* — Timothy J Thompson
*Assistant Examiner* — Guillermo J Egoavil
(74) *Attorney, Agent, or Firm* — Barnes & Thornburg LLP; Michael A. Carrillo

(57) ABSTRACT

A quick installed autonomous traffic and pedestrian crossroad signaling system employing a mechanical support wire spanning between at least two structural support points, and an electrified wire with a plurality of hub receptacles running alongside the mechanical support wire whereas electrified devices are coupled to the hub receptacles.

11 Claims, 5 Drawing Sheets

Related U.S. Application Data which is a division of application No. 15/694,560, filed on Sep. 1, 2017, now Pat. No. 10,292,289.

(60) Provisional application No. 62/963,779, filed on Jan. 21, 2020.

(51) Int. Cl.

| | | |
|---|---|---|
| *F21S 8/06* | (2006.01) | |
| *F21V 23/00* | (2015.01) | |
| *G05B 15/02* | (2006.01) | |
| *G06N 5/02* | (2006.01) | |
| *H01R 13/73* | (2006.01) | |
| *H01R 33/05* | (2006.01) | |
| *H01R 33/88* | (2006.01) | |
| *H01R 33/90* | (2006.01) | |
| *H05K 5/02* | (2006.01) | |
| *H01R 13/00* | (2006.01) | |
| *H04B 1/38* | (2015.01) | |
| *B05B 9/04* | (2006.01) | |
| *H01R 33/945* | (2006.01) | |

(52) U.S. Cl.
CPC ............... *H01R 33/90* (2013.01); *B05B 9/04* (2013.01); *H01R 13/005* (2013.01); *H01R 33/945* (2013.01); *H04B 1/38* (2013.01)

(58) Field of Classification Search
CPC ........ H01R 33/05; H01R 33/88; H01R 33/90; H01R 33/945; H05K 5/0256; H05K 5/02
USPC ........ 361/729; 340/933, 907, 908, 917, 935; 701/117, 118, 119
See application file for complete search history.

(56) References Cited

U.S. PATENT DOCUMENTS

| | | | |
|---|---|---|---|
| 9,544,976 B2 | 1/2017 | Snyder et al. | |
| 9,615,066 B1 | 4/2017 | Tran et al. | |
| 9,671,072 B1 | 6/2017 | May | |
| 9,699,836 B2 | 6/2017 | Bahrehmand | |
| 9,890,937 B2 * | 2/2018 | Townsend, Jr. | ........ G08G 1/095 |
| 10,653,014 B2 * | 5/2020 | Spiro | ........ H05B 47/19 |
| 2006/0095199 A1 * | 5/2006 | Lagassey | ........... H04L 65/4069 |
| | | | 701/117 |
| 2008/0094423 A1 | 4/2008 | Summerland | |
| 2008/0158354 A1 * | 7/2008 | Hutchison | .............. G08G 1/095 |
| | | | 348/143 |
| 2010/0124059 A1 | 5/2010 | Duffy et al. | |
| 2010/0262297 A1 | 10/2010 | Shloush et al. | |
| 2011/0010019 A1 | 1/2011 | Shloush et al. | |
| 2013/0163231 A1 | 6/2013 | Chen | |
| 2014/0125131 A1 | 5/2014 | Lalitnuntikul et al. | |
| 2015/0008829 A1 | 1/2015 | Lurie et al. | |
| 2015/0373796 A1 | 12/2015 | Bahrehmand | |
| 2015/0379869 A1 * | 12/2015 | Ferguson | ......... G08G 1/096791 |
| | | | 701/117 |
| 2016/0072638 A1 | 3/2016 | Amer et al. | |
| 2016/0110782 A1 | 4/2016 | Tadajewski | |
| 2016/0195856 A1 | 7/2016 | Spero | |
| 2017/0027045 A1 | 1/2017 | Chemel | |
| 2017/0099353 A1 | 4/2017 | Arora et al. | |
| 2017/0227204 A1 | 8/2017 | May | |
| 2017/0372602 A1 * | 12/2017 | Gilliland | ................. G01S 17/66 |
| 2021/0245711 A1 * | 8/2021 | Nagata | ............... H04N 5/23218 |

FOREIGN PATENT DOCUMENTS

| | | |
|---|---|---|
| CN | 105471724 | 4/2016 |
| CN | 205336611 | 6/2016 |
| CN | 205754988 | 11/2016 |
| DE | 102006022640 | 11/2007 |
| WO | 2009012231 | 1/2009 |
| WO | 2016118022 | 7/2016 |
| WO | 2017120219 | 7/2017 |

OTHER PUBLICATIONS

Salisbury, Jon, Internet of Things—Smart Home Explained, blog post, Sep. 27, 2016, https://nexigen.com/blog/2016/09/27/internet-of-things-smart-home-explained/, 5 pages.

Alsheikh et al., Machine Learning in Wireless Sensor Networks: Algorithms, Strategies, and Applications, School of Computer Engineering, Nanyang Technological University, Singapore, Sense and Sense-abilities Programme, Institute for Infocomm Research, Singapore, 23 pages.

Blackstock et al., IoT Interoperability: A Hub-Based Approach, 2014 International Conference on the Internet of Things (IOT), Oct. 6-8, 2014, Cambridge, MA.

\* cited by examiner

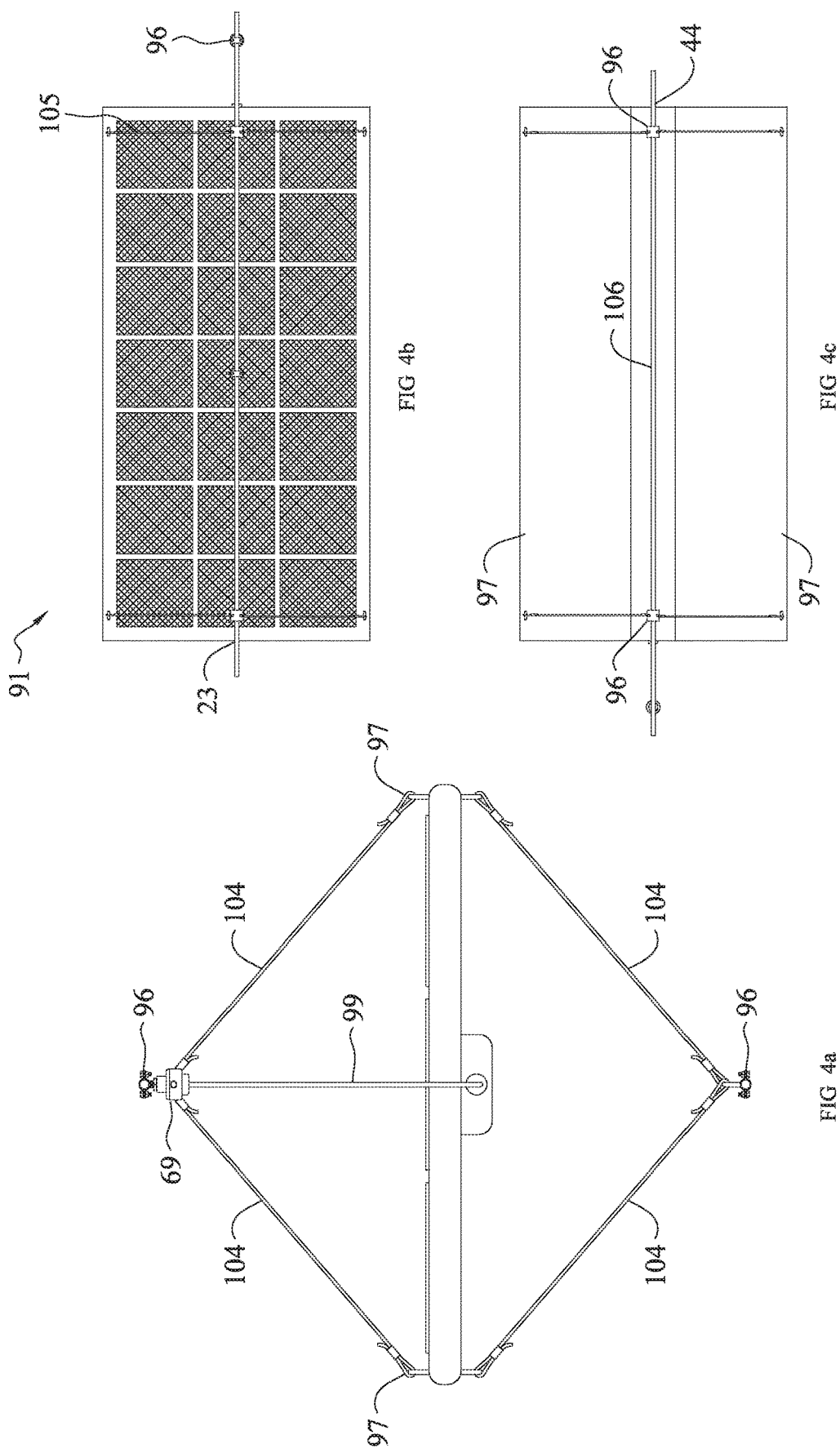

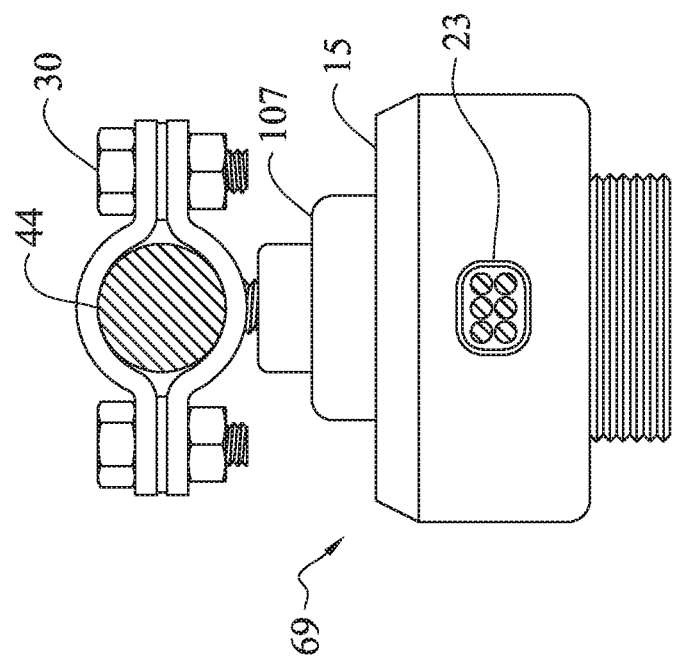
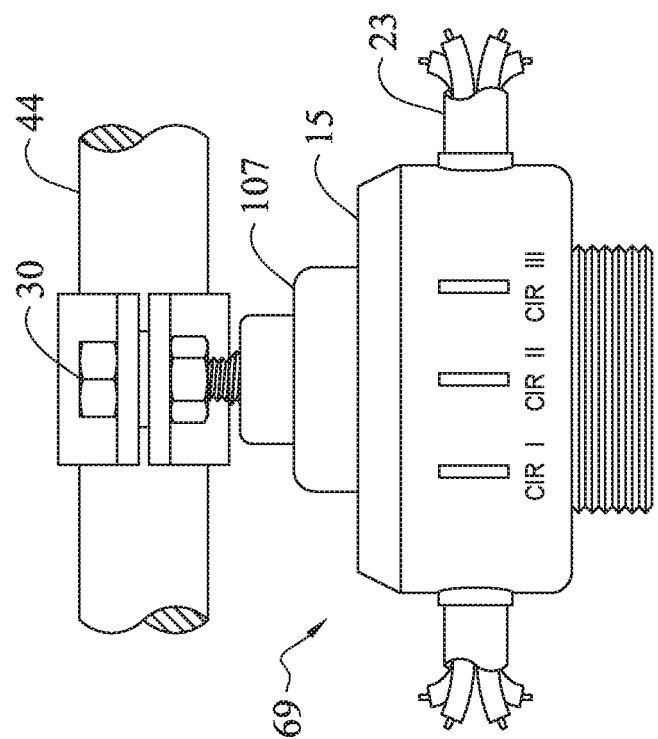
FIG 5b
FIG 5a

WIREPORT ASSEMBLY

CROSS REFERENCE TO RELATED APPLICATIONS

This application is a continuation-in-part of the earlier U.S. Utility patent application Ser. No. 16/191,937, filed Nov. 15, 2018, now U.S. Pat. No. 10,716,229, issued Jul. 14, 2020, which is a divisional of the earlier U.S. Utility patent application Ser. No. 15/694,560, filed Sep. 1, 2017, now U.S. Pat. No. 10,292,289, issued May 14, 2019; and this application claims priority to U.S. Provisional Patent Application Ser. No. 62/963,779, filed Jan. 21, 2020, the disclosures of which are hereby incorporated entirely herein by reference.

TECHNICAL FIELD

This invention relates generally to a wired device and more particularly to a wireport assembly for an automated, self-powered, quick to install roadway intersection signaling system.

BACKGROUND

The global weather in the last decade has shown hurricanes/cyclones and tornadoes becoming more violent. Annual rainfall in some regions of the world has exceeded historical records resulting in massive flooding. In western U.S., drought and warmer year-round temperatures have resulted in devastating fires. When natural forces rain havoc on urban areas, electrical power service is often disrupted. Exposed to high wind and/or fire, infrastructure power and communication distribution networks can be destroyed. For example, in 2017, Hurricane Maria destroyed much of Puerto Rico's power distribution grid, causing significant hardship to first responders and the general population. In such events, the first responders' priority is to save lives and restore order. Among the first tasks the first responders carry out is to clear the roads of debris to enable emergency and food supply vehicles to pass through. In the absence of electrical power, the city's traffic lights are inoperative. In fact, subjected to hurricane wind, they may no longer exist. To manage the roadway intersection signaling first responder personnel is required to manage key intersection signaling wherein their presence is needed elsewhere where they can save lives. To overcome this problem, a self-powered quick to deploy automated traffic and/or pedestrian roadway signaling system can replace needed human resources.

SUMMARY

An embodiment includes a wireport assembly comprising: a linear conductor; a plurality of devices; and a plurality of hubs integrated with the linear conductor along the length of the linear conductor, wherein each device of the plurality of devices is directly mounted to a hub of the plurality of hubs or indirectly mounted to the hub with a device platform, wherein the plurality of hubs are configured to provide mechanical connectivity, mechanical and electrical connectivity, or mechanical, electrical and data connectivity between the linear conductor and the plurality of devices.

Another embodiment includes a removable device platform comprising: a mechanical receptacle adapted to mechanically connect to a device and a hub, the hub integrated with a linear conductor, the mechanical receptacle to convey power or power and data from the linear conductor to the device; and at least one of a hub power receptacle, a device power receptacle, a wireless transceiver, a back-up power unit, a processor, a micro-switch, a spray nozzle, and a power supply/modulation unit.

Yet another embodiment includes a hub comprising: a mechanical receptacle; an electrical receptacle; and a data receptacle, wherein the hub is integrated into a prime conductor wire the receptacles providing mechanical connectivity, mechanical and electrical connectivity or mechanical, electrical and data connectivity to a device mounted to the hub.

The foregoing and other features and advantages of the present invention will be apparent from the following more detailed description of the particular embodiments of the invention, as illustrated in the accompanying drawings.

BRIEF DESCRIPTION OF THE DRAWINGS

A more complete understanding of the present invention may be derived by referring to the detailed description and claims when considered in connection with the Figures, wherein like reference numbers refer to similar items throughout the Figures, and:

FIG. 4a shows a side elevation of an automated, self-powered, quick to install roadway photovoltaic intersection power generating device according to an embodiment;

FIG. 4b shows a top elevation of an automated, self-powered, quick to install roadway intersection photovoltaic power generating device according to an embodiment;

FIG. 4c shows a bottom elevation of an automated, self-powered, quick to install roadway intersection photovoltaic power generating device according to an embodiment;

FIG. 5a shows an enlarged longitudinal view of the automated, self-powered, quick to install roadway intersection conductors cable hub receptacle according to an embodiment; and FIG. 5b shows an enlarged transverse view of the automated, self-powered, quick to install roadway intersection conductors cable hub receptacle according to an embodiment.

LIST OF ELEMENTS IDENTIFIED IN THE DRAWINGS

Figure 1A:
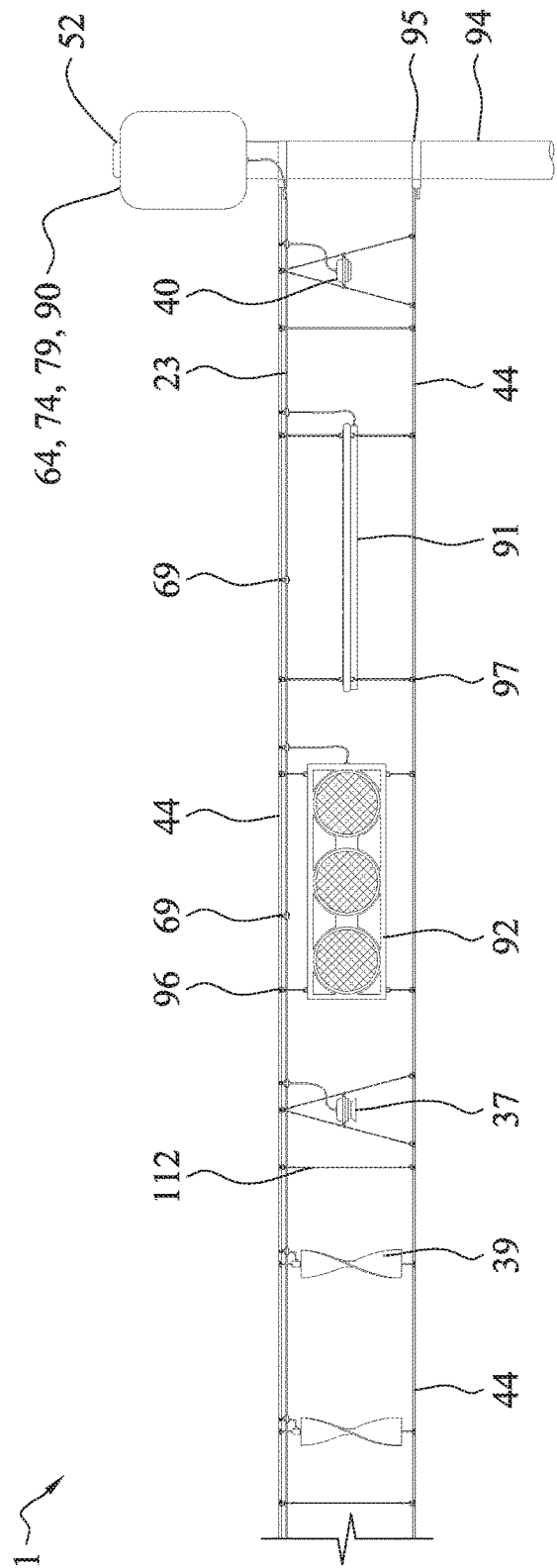
FIG. 1a shows a partial frontal view of an automated, self-powered, quick to install roadway intersection signaling device platform according to an embodiment.

1. Wireport assembly
2. Threaded caps
15. Hub
23. Primary conductors cable
30. Cable hanging loop
31. Hub receptacle
33. Light sources
36. Luminaire assembly
37. Hub receptacle
38. Occupancy sensor/photocell assembly
39. Wind turbine
40. Speaker/microphone assembly
41. Air quality/temperature sensor assembly
44. Cable
50. Driver
51. Micro-processor
52. Transceiver
55. Wireport wire suspended electrical device
56. Suspension hook/clamp/mechanical fastener
57. receptacles
63. data receptacle
64. Power management module
69. Hub and caps assembly
74. Master processor/controller
79. Power storage device
90. Data input/output port/s
91. Photovoltaic panel
92. Signaling device
93. Electrified signage
94. Pole
95. Strap
96. Hanger
97. Fastening device
98. Visor
99. Cord and plug
100. Heat dissipating fin
101. Frame
102. Back strip
103. Light source panel
104. Adjustable rigid fastener
105. Photovoltaic cell
106. Photovoltaic power strip
110. Cable/chain
111. Radar
112. Hub receptacle threaded coupling

DETAILED DESCRIPTION

The present invention relates to a wireport device assembly platform generally including an electrified linear prime conductors cable containing a plurality of integrated hubs located along the cable's span mechanically coupled to a mechanical support cable providing electrical and data connectivity to a plurality of removable device platforms with device assemblies coupled thereto.

More specifically the present innovation aims at providing rapidly deployed self-powered traffic signaling systems to populated localities subject to severe weather having undependable and/or non-existent electrical power supply grid.

The present innovation is an automated, self-powered, quick to install roadway intersection signaling system. The innovation is a continuation to U.S. Pat. No. 10,292,289 (now allowed) and application U.S. Patent Publication No. 2019/0090371. This innovation adapts the core patented novelty to provide a solution to communities devastated by a disaster where control roadway traffic signaling must be restored in short order. The signaling system is a modular and scalable assembly composed of at least one of a structural suspension linear cable fastened to two support end points, a power or power and data linear conductors with a plurality of hubs receptacles spaced apart along the cable length, at least one device coupled to said conductors cable hub receptacles, a power management module enclosure containing a power supply, a power storage device, a processor/controller with resident memory and code and an optional transceiver.

In the wake of a natural and/or manmade disaster existing structures supporting signal devices and/or lighting devices may be destroyed or rendered unusable. This innovation's mounting system can make use of existing vertical structures such as poles, elevated horizontal surface/s and/or walls to the extent that they are structurally sound. In the absence of the sound vertical and/or horizontal mounting surface/s, ready to ship poles can be transported to the devastated locality. The poles can be embedded directly in the ground or placed in a prefabricated foundation also readily available for transport. An example of such foundation is taught in applicant's U.S. Patent Publication No. 2019/0169814. The pole foundation in this patent for the ballasting purpose can be filled with sand, gravel, or water.

Altogether the signaling system design minimizes the devices' weight and surface size to reduce structural loading. For reasons of brevity this innovation teaches of a two structural suspension cables mounted at both ends to poles with a power or power and data conductor cable mounted below the top structural suspension cable extending the length of the cable. In between the two cables, several I/O generating electronic devices are mounted secured to the top or top and bottom of the structural cables with an outdoors rated wire and/or arms. To eliminate the risk of harmonic action, the pole can be fabricated from material non-conducive to harmonic action and/or employ dampening device/s.

These electrical devices connect to the power or power and data conductors cable hub receptacle directly or by an outdoor rated cord and plug cable having a connector that connects to the conductors cable hub receptacles. The power or power and data conductors cable connects to a typically pole or wall mounted power management module enclosure. The enclosure retains at least one of, a power storage device, processor/controller with resident memory and resident code, power management module and a communication device.

The traffic wireport is an automated cable suspended traffic signaling platform. This signaling platform is configured to be self-powered and/or receive power from external source. The present embodiment employs two suspended mechanical support cables 44 vertically positioned one on top of the other and secured to vertical support structures 94. The spacing between the mechanical support cables 44 is typically constant and the cables 44 are typically mounted horizontal to the ground surface. The cables 44 can made of metallic and/or nonmetallic material or a combination thereof. The cables 44 are configured to be noncorrosive and resistant to the elements. Metallic cables 44 can be treated and coated with a polymer resistant to UV. The cables' 44 thermal expansion coefficient is negligible, and the cable caliber is sized to support all possible devices' configuration factoring also environmental condition loads. The cables 44 can be secured to the pole 94 with straps 95, torqueing screws, counterweights or any other durable means for secured suspension. The suspended device support mechanical cable 44 can mount to at least one of; a wall, an elevated surface, a pole 94 or any other vertical or horizontal structure/s capable of withstanding the structural loading applied on the wireport platform system.

The primary conductors cable 23 comprised of at least one circuit, carries single and/or bi-directional power between the power management module 64 and at least one cable mounted electrical device 55. The conductors cable 23 can also transmit single or bidirectional communication signal/s. Having power generating devices 91, 39 coupled to the conductors cable 23, power can also flow directly between the cabled mounted electrical devices 55. The conductors cable 23 employs a plurality of hub receptacles 31, 57. The hub receptacles 31, 57 are factory pre-configured to be spaced apart and populate the length of the conductors cable 23.

The hub receptacles 31, 57 can be configured to employ a single circuit or be multi-circuited. The multi-circuited hub receptacle 31, 57 can be configured to allow device circuit selectivity. The primary conductors cable 23 can employ a plurality of hub receptacles 31, 57 that differ from one another by size, shape, circuitry, and means of power, data, or power and data connectivity to the electrified wired mounted devices 55. The present embodiment shows in FIG. 15 circuit designations on the hub receptacle 31, 57. These designations are configured to align the cord and plug 99 connector orientation with the selected device 55 circuit. In another embodiment (not shown), the hub receptacle 31, 57 may have a circuit selector lever. Yet in another embodiment (not shown), a circuit rotating ring can be used and so on. When a hub receptacles 31, 57 are not occupied by a cord and plug 99 connectors, threaded caps 2 (not shown), isolates the hub receptacles 31, 57 from the elements.

The present embodiment employs a coupling element that enables coupling the conductors cable 23 hub receptacle 31, 57 to the suspended mechanical support cable 44. In addition, straps 95 or other coupling device/s can also be placed intermittently between the conductors cable 23 hub receptacles 31, 57 of devices to eliminate cable 23 slack. The latter is used when spacing between such hub receptacles 31, 57 is exceedingly long. In U.S. Pat. No. 10,292,289, the applicant teaches about the receptacle's means of connectivity to the devices and to the suspension cable 44. FIGS. 3D, 5A-5D, 6F, and 8A-8C shows an example of a cross-sectional view of one embodiment of a hub receptacle 31, 57.

The present innovation can include several conductors inside the prime conductors cable 23 insulated exterior enclosure. The conductors can transmit power, data, or a combination thereof. Given the relatively low electrical loads the wireport platform devices 55 consume, the relatively short distance between the power management module/s 64 and a device 55, and the hazardous risk of using line voltage, this innovation focuses on low voltage power systems. Other advantages of low voltage systems are the ability of using PoE and avoiding the use of stepdown device transformers. Nonetheless, line power systems can be configured for the wireport device platform system especially when a lengthy suspended span is required.

The wireport platform devices 55 receive their power from a power management module 64 typically mounted and/or attached to a vertical structure that supports the suspended cabled device platform. In some embodiments, the power management module 64 can be ground mounted in a sheltered enclosure or located on a structure nearby. Though these configurations are possible, they are not recommended. In a different embodiment (not shown), cable mounted power generating device/s can directly supply power to cable mounted power consuming devices, support structure devices and/or nearby devices. In yet another embodiment (not shown), power to the power consuming devices can be transmitted from both the power management module 64 and the cable and/or structure mounted power generating device/s.

This innovation adapts the wireport device platform to operate as an autonomous traffic signaling system. Employing power generating devices 91, 39, the system does not rely on wired power or power and data connectivity to a grid. However, when available, it is possible for the system to connect and operate under grid power or power and communication. In such scenarios, when power is disrupted, the system can switch over to the self-powered autonomous mode.

There are several autonomous power generating sources capable of providing power to the signaling system. These power sources include wind, solar, geothermal and fuel cell. For reasons of brevity, this innovation teaches only on solar and wind generated power devices. The generated power is stored in a power storage device 79 housed inside a weather proofed enclosure typically mounted to a vertical structure in the proximity of the cabled system. The enclosure is referred to herein as the power management module 64.

Inside the power management module's 64 enclosure are at least one of a master processor/controller 74 with resident memory and code, a transceiver 52 and a power storage device 79. The processor's 74 program/s may employ AI code and can receive input from at least one external device 55, process the input in conjunction with other resident and/or remote inputs/parameters and generate output to at least one system mounted device 55, device/s 55 in proximity and/or remote device/s 55. The processor 74 can employ basic code and/or AI code The processor operating the AI code can in real time accurately predict events outcomes factoring the environmental conditions sensed in the vicinity of the system, remotely communicated inputs, and locally programmed operational parameters and resident stored data. The AI code can employ self-learning algorithms that improve the wireport device platform's efficiency. The AI code can generate outputs that prioritize and control the operation mode of each device 55 coupled to the primary conductors cable 23 or the primary conductors cable 23 and remote devices 55. Signal to or from the system network of devices can be transmitted by means of wire, wireless and a combination of both thereof.

The electrical devices 55 coupled to the suspended primary electrical cable 23 can include at least one of a power generating 91, 39, a sensing device 37, 38, 41, 111, a signaling device 92, 93, other output device 36, 40, and a communication device 52. The suspended primary conductors cable 23 can span across the length of the mechanical support cable/s 44 or a portion of it. A single primary electrical conductors cable 23 can be employed or a plurality of cables 23, wherein each cable 23 can employ several circuits.

In this embodiment the power generating devices include photovoltaic panels 91 and wind operated micro turbines 39. The power generating devices' generated output is regulated not to exceed higher output than an allowable threshold. For example, if the wind velocity exceeds a pre-determined speed, the micro turbine 39 will stop generating power or generate power intermittently. In some conditions, excess power generated can be discharged to the ground. Also, the mechanical or the mechanical and electrical suspended cabled 23, 44 system can discharge to the ground external power overloads like lightning strike without damaging the system's devices 55.

The photovoltaic panel 91 top surface retains photovoltaic cells 105 that convert solar energy to electrical power. The panel depth is minimal, and its position is horizontal relative to a ground level, to reduce wind load stresses on the cabled system 44. In some latitudes, the panel 91 can be tilted to maximize exposure to sun angle. Power generated from the photovoltaic cells 105 can be stored onboard on the panel's 91 back strip 102 and/or conveyed to the power management module's 64 power storage device 79. The power can also be transmitted directly to neighboring device/s 55 while transmitting excess power to the power storage device 79. The panel 91 employs mechanical and electrical means of connectivity. The mechanical means include top and bottom cables/chains/110 or rigid rod restrainers 104 fixing the panel 91 in position. Electrically, a detachable weather protected cord and plug 99 extends from the panel 91 to a reciprocating hub receptacle connector 112 coupled to the primary conductors cable 23. The panel's 91 length and width is scalable per an application's requirement.

Power generated from a wind micro turbine 39 can be used in locations where prevailing wind is common. The benefit of a wind turbine 39 is its ability to generate power throughout the day cycle. The wind turbine power storage and distribution circuitry is configured the same or similarly to the photovoltaic panelized system 91 including the means of connectivity to the cable primary conductors cable 23 hub receptacles 31, 57. The scaling of the device 39 is proportionate to the mechanical support cable 44 capacity to withstand wind loads and torque forces exerted by the rotating turbine 39. The wind turbine 39 can be affixed to the top and the bottom of the suspension mechanical support cables 44 by adjustable rigid rods 104.

The sensing devices include at least one of visual devices 37, occupancy devices 38, audio devices 40, air quality/barometric pressure devices 41. Other sensing devices can include vibration, radiation, and wind velocity meter sensors, or any other sensing device specifically required. These devices have output capability or output and input capability operating independently or in conjunction with other device/s. At least one device can be governed by a master processor/controller 74 and/or by a localized device processor/controller. Devices likely to be employed include camera/s 37 operated by a master processor/controller 74.

The camera/s 37 can provide the processor 74 real time inputs which are processed by the processor. The input compiled with stored program/s parameters and other local and remote device input/s are compiled, generating output/s. The output/s are transmitted to coupled onboard and/or nearby signaling system devices 92, 93. For example, a camera 37 can provide input data and/or vehicle/s and/or pedestrian traffic approaching an intersection and already located in the intersection. In conjunction with other intersection signaling systems, the processor/controller 74 program/s can gauge the intersection's traffic load and make device 92, 93 output decision/s that optimize the traffic flow through the intersection. Supported by AI code, the camera's 37 input to the processor/controller 74 can prioritize the sequencing of the intersection's traffic signals by visually identifying approaching vehicles/pedestrians or in conjunction with signal/s transmitted by vehicle/s to the system's transceiver 52. Other functionality the camera 37 can provide include inputs on anomalies such as traffic accidents, road flooding, debris, and/or potholes. The sensors can generally but not always connect directly to a conductors hub receptacle 31, 57 whereas the hub's receptacle 31, 57 has a built in mechanical fastener 56 to secure the device to the suspended mechanical support cable 44. Other output devices operating independently or in conjunction with other devices can include at least one of a light source 36, a speaker 40, a transceiver 52, a signage board 93, a signaling device 92, other sensing devices consuming power and also generating outputs.

The wireport traffic platform includes the traffic signal 92. The most common traffic signal device 92 employs a three-light red, yellow and green signal illuminated by LED or OLED light sources 33. The traffic signaling device 92 panel can be made of metal and/or non-metallic material. The traffic signaling device's 92 form factor height and width conform to regulatory standards. Its depth is minimal and so is its weight. The autonomous traffic signaling device 92 is typically configured to employ wired connectivity. The traffic signaling device 92 receives real time input from the signaling controller. A different embodiment (not shown) can employ at the panel's back, an enclosure having at least one of connectivity couplers to the light sources 33, a driver 50, a wireless communication module 53, a micro-processor 51, a program residing on a resident memory board and/or a local power storage device 79.

At the back of the traffic signaling device 92, the LED light source panel 103 is electrically coupled to at least one electrical device housed inside the back strip 102 with heat dissipating fins 100, located at both side of the strip 102, rapidly dissipate heat generated by the light source/s 33. At the front side of the panel, visors 98 positioned over the light source panel 103 shade the light sources 33 from exposure to direct sunlight while protecting the lens from the elements. The frame of the traffic signaling device 92 enables quick mechanical connectivity to the suspension cable system 44. The panel 103 employs aircraft cable with latching devices located at its top and bottom surfaces. To minimize the wind load stresses acting on the traffic signaling device 92, the device surface area can be reduced to only the support frame and the light source panels with the spaces between them voided. Air passing through will help remove the heat generated by the light source 33 and its associated electrical components. The traffic signal device 92 employs a detachable weatherproofed cord and plug 99 with a connector compatible with the conductors cable 23 hub receptacle 31, 57, 112. The traffic signaling device 92 can be mounted horizontally or vertically and can be scaled to meet jurisdiction requirements.

In addition, the cabled suspended system 23, 44 can employ other signaling power devices 93 including a single color or multi-color flashing or non-flashing illuminated device/s that can change color and image/text content. Such signaling devices 93 can be configured to operate in concert with the traffic signaling device 92 or independently. These devices may include vital information messaging boards displaying text and/or images. Other signaling devices may include auditory devices such as speakers 40.

The embodiment's communication devices can receive and transmit inputs to the onboard cable assembly electrical devices 55, a plurality of cable assembly devices within an intersection, a plurality of cable assembly and non-cable mounted devices in the proximity of the intersection, and/or remote stationary and/or mobile devices. The communication can be wired and/or wireless. For example, an approaching emergency vehicle can transmit a signal to the intersection's transceiver/s 52. The transceiver/s 52 relay the signal to the assembly/ies' master processor/controller 74 to anticipate the vehicles' arrival and prioritize the traffic light green signal accordingly. In another example, a cable mounted camera 37 monitors the intersection's vehicular and pedestrian load in real time. The camera 37 transmits the information to the processor 74. The processor 74, in turn, sequences the intersection's traffic light device's 92 green signal by first analyzing the traffic directionality and load, prolonging the green light signal as necessary. In yet another example, the electrified road signage 93 can independently or in conjunction with the traffic signaling device/s become a messaging board, also announcing a detour and/or road hazard/s ahead.

Figure 1B:
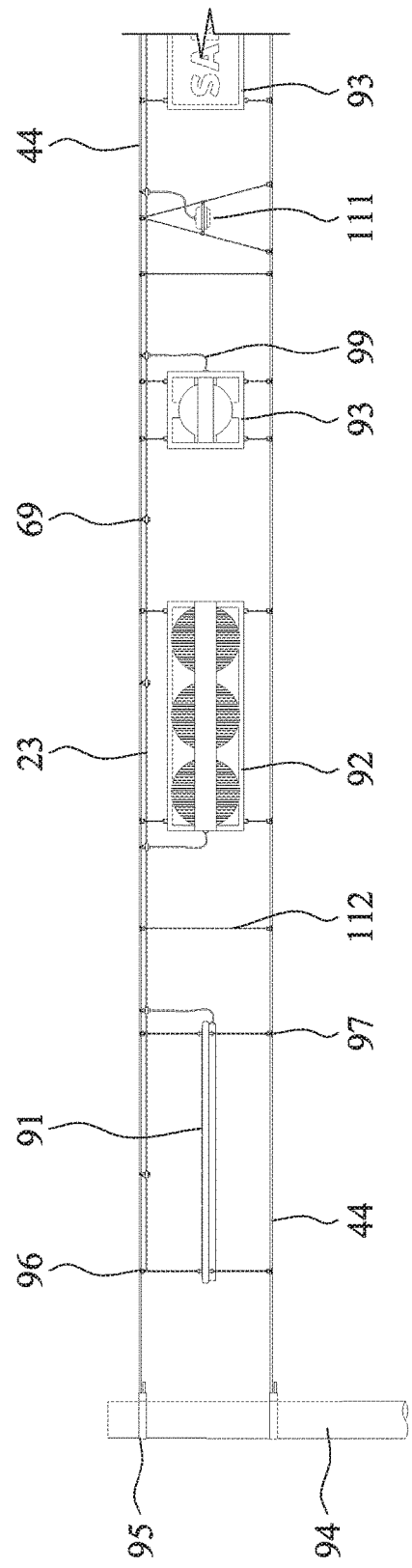
FIG. 1b shows another partial frontal view of an automated, self-powered, quick to install roadway intersection signaling device platform according to an embodiment.

FIGS. 1a and 1b show two partial elevations of cabled embodiments suspended between two poles.

FIG. 1a shows the embodiment's structural support system comprised of top and bottom cables 44 suspended from a pole 94 vertically spaced apart. The cable 44 is secured to a fastening device. The fastening device, in turn, is secured to the pole 94. In this figure, the fastening device shown is a strap 95. To maintain cable tension, weights, spring loaded devices or other cable tension devices can be used (not shown). The cable 44 can be made of metallic or non-metallic material sized to withstand the maximum dead loading possible, harshest environmental conditions, and any acceptable safety factor/s. Metallic cables can be treated against corrosion and/or be coated with a protective coating, resistant to UV. Similar to the cable, the fastener can be made of metallic or non-metallic material, including bolts, washers, and any other auxiliary fastening element employed. The pole can be made of one or several modular sections that can be rapidly field assembled. The pole's profile can be square, round, or any other shape sufficiently strong to support the suspected cable assembly loading, its direct axial loading, environmental conditions including soil conditions and safety factors. The pole can be made of metallic or non-metallic material. Metallic poles can be treated by painting to resist the elements and/or by galvanizing. Another means is through anodizing. Non-metallic poles can be coated by UV protective paint layer/s. To eliminate harmonic action a dampening device (not shown) can be placed inside the pole. This figure shows a power management module 64 on the pole 94, with a transceiver 52 on top. Key elements of the assembly's embodiments are housed inside the power management module 64. These key elements include at least one processor/controller 74 and resident memory operated by code that can include AI algorithms, input and output ports 90. The power management module 64 can manage power generated by the suspended cable mounted devices 55, by remote tap in to grid power or generator power, or a combination of the two.

The cable mounted traffic control embodiment is an autonomous power generating system wherein the power generated is consumed by the cable and pole mounted devices. In other configurations, power consuming device/s in proximity to the cable system and pole/s can be energized by the cable system. The embodiment can also connect to an external power source temporarily or permanently. In this figure, the power is generated by photovoltaic panel/s 91 and a wind generated turbine 39. The power generated can flow to the power storage device and/or directly to at least one power consuming device. The power storage device is configured not to overload under extreme wind and/or solar conditions. In such events, sensing devices disengage the flow of power to the storage device and/or the cable mounted device/s. The power generated can energize at least one traffic signal 92, a camera 37, a speaker/microphone 40, a transceiver 52, a processor/controller 74, electrified signage 93, and any other power consuming device including wireless communication devices mounted on the cabled system, on the pole, and in the embodiment's vicinity.

FIG. 1b shows a partial elevation of the assembly with a pole without a power management module housing. The size of the power management module is contingent on the cable system devices' power needs and the environmental conditions. In some embodiments, a power management system is placed on top of each pole (not shown). The present embodiment shows the power management module 64 conductors 23 extending from the module to the midpoint of the cable suspended embodiment. The power or power and data cable 23 employs a plurality of hubs 69. The hubs are factory fabricated, preconfigured on a repeated spacing module. The cable mounted devices are coupled to the hub 69 by weather resistant cord and plug 99 conductors. The cord and plug 99 conductors engage the hub's 69 device platforms' power or power and data receptacle 63. In some embodiments, the hub 69 may include a circuit selector (not shown). The cable mounted devices include a mechanical fastening device 97 that minimizes the device's movement and a plurality of hangers 96 to hang the power or power and data cable 23 from the top and/or bottom cables 44.

Figure 2:
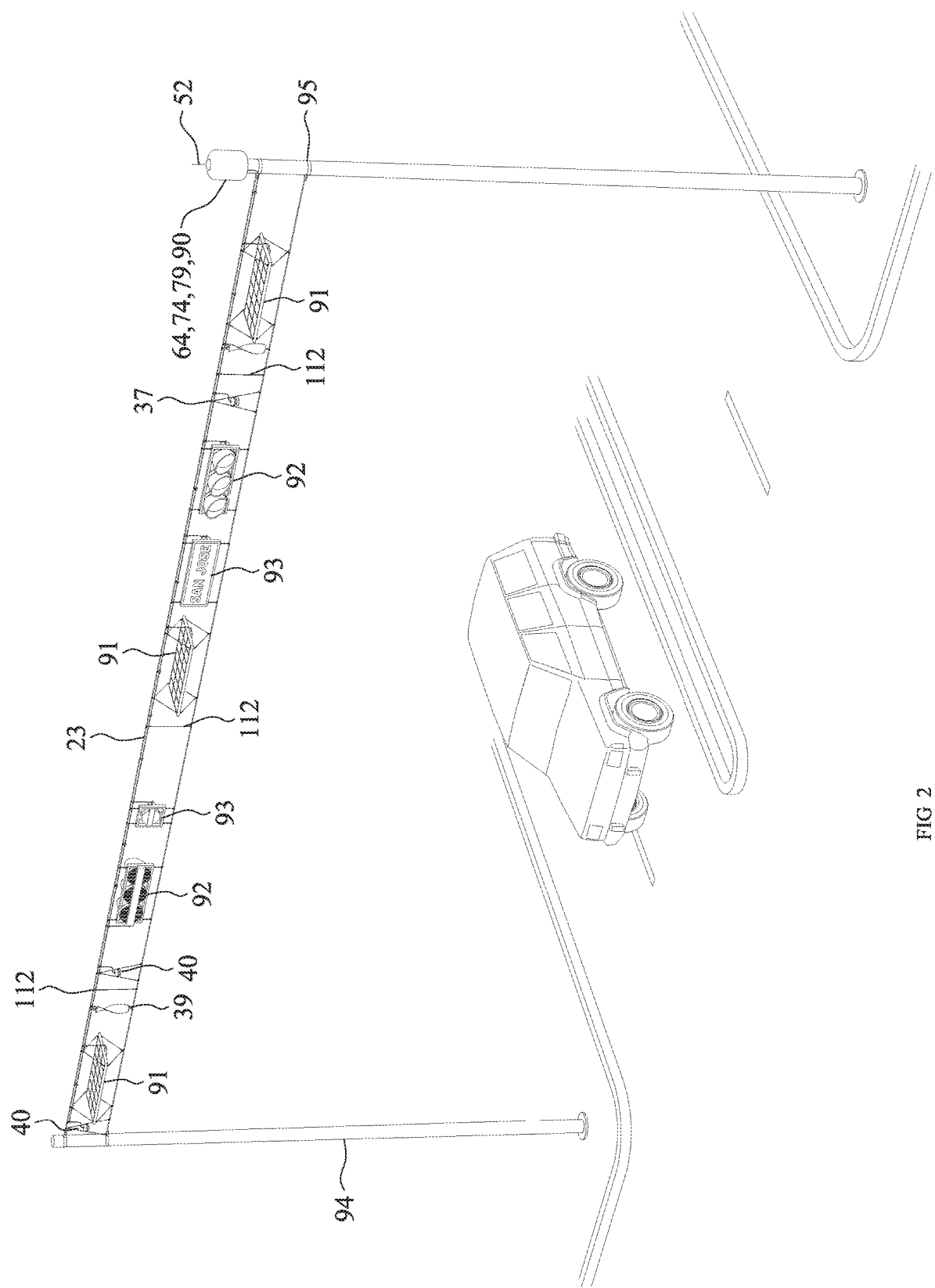
FIG. 2 shows a perspective view of an automated, self-powered, quick to install roadway intersection signaling device platform according to an embodiment.

FIG. 2 shows a perspective view of the suspended traffic control wired assembly spanning between two poles. The poles are located at an opposite side of an intersection, having the wired assembly suspended over two bi-directional two-lane roads with an island between. The assembly elements are the same as shown in FIGS. 1a and 1b, with the exception showing the pole 94 embedded in the ground. The key elements shown include the power management module 64 housing located on the pole 94, top and bottom cables 44 secured to the pole 94 with wraparound straps 95, power or power and data primary conductors cable 23 coupled to the power management module 64 housing extending the length of the spanned cable 44 assembly and suspended by hangers 96 from the top cable 44. In another embodiment, a pole 94 can be embedded inside the prefabricated foundation locally obtained or supplied along with all other modular assembly elements. The latter foundation can be made of material inert to the elements and can be ballasted by liquid and/or sand/gravel. A reference for the ballasted method can be found in US Patent Publication No. 2019/0169814 A1 related to a pole foundation. The device coupled to the primary conductors cable 23 can include at least one of: electrical signage 93, signaling device 92, photovoltaic panel 91, camera 37, radar 111, power generating turbine 108, speaker/microphone 40, light source 36, and transceiver 52. Other electronic or electromechanical devices can be adapted to be coupled to the suspended mechanical and/or electrical cabling system. These devices may include: air quality sensor, wind velocity meter, and barometric sensor (not shown). The devices mounted on the suspended cable, the pole/s, and/or the devices placed in proximity to the cable wired system can be communicatively wired or wireless to the assembly processor 74 and/or to a device embedded processor coupled to a communication module.

FIGS. 3a-3e show views of the traffic signaling device 92. The signaling device shown is configured to operate horizontally. In other embodiments, the traffic signaling device can be configured to operate vertically. The signaling device 92 coupled to the cabled system is configured to generate minimal surface area wind resistance. It is also configured to have minimal weight. The signaling device can be made of heat dissipating, UV and corrosion resistant polymer, and/or lightweight heat dissipating and corrosion resistant metal.

Figure 3E:
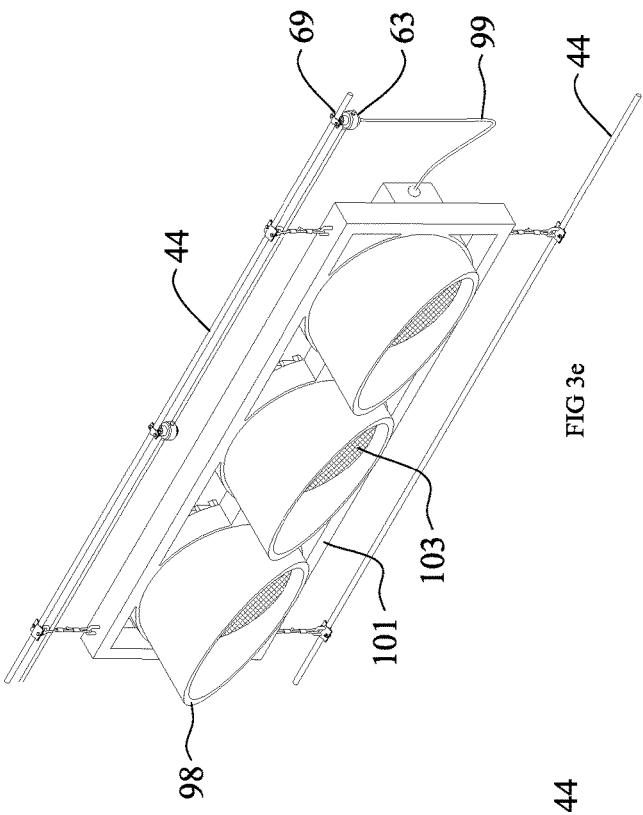
FIG. 3e shows a perspective of an automated, self-powered, quick to install roadway intersection signaling device according to an embodiment.
Figure 3A:
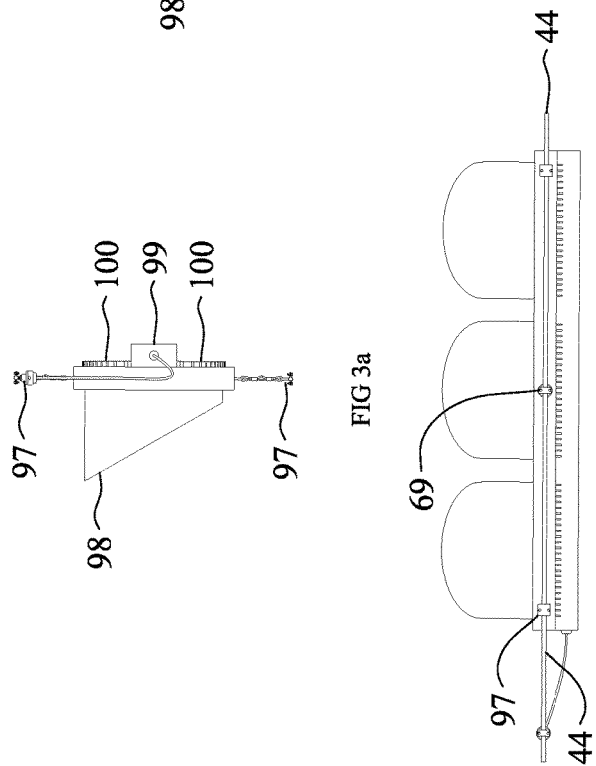
FIG. 3a shows a side elevation of an automated, self-powered, quick to install roadway intersection signaling device according to an embodiment.

FIG. 3a shows a side elevation of the signaling device 92. Elements shown include top and bottom fastening devices 97 coupling the signaling device to the top and bottom suspended mechanical support cables 44. A cord and plug 99 receptacle is shown coupled to the back strip 102 side. Heat dissipating fins are shown on the signaling device 92 light source back, and a sun shading visor 98 is shown at the light emitting side of the signaling device 92. The signaling device employs a highly efficient planar light source having a slimline profile, thus reducing the wind drag on the signaling device.

Figure 3B:
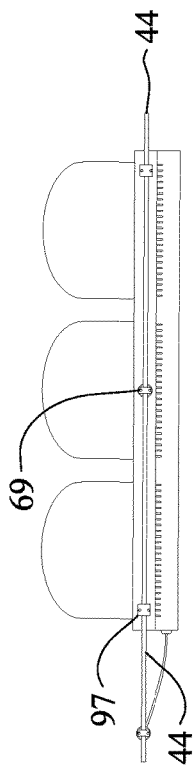
FIG. 3b shows a top elevation of an automated, self-powered, quick to install roadway intersection signaling device according to an embodiment.

FIG. 3b shows a top view of the signaling device 92 and the power or power and data cable 23 suspended from above. The signaling device 92 light source panels 103 are concealed from view by the signaling device frame 101. The frame 101 provides flat rigid surfaces for the fastening devices 97, also providing protection to the electronic assembly from shipping and installation damage. Elements shown include the frame 101, the visor 98, fastening devices 97, and above hubs 69 coupled to the power or power and data cable 23.

Figure 3D:
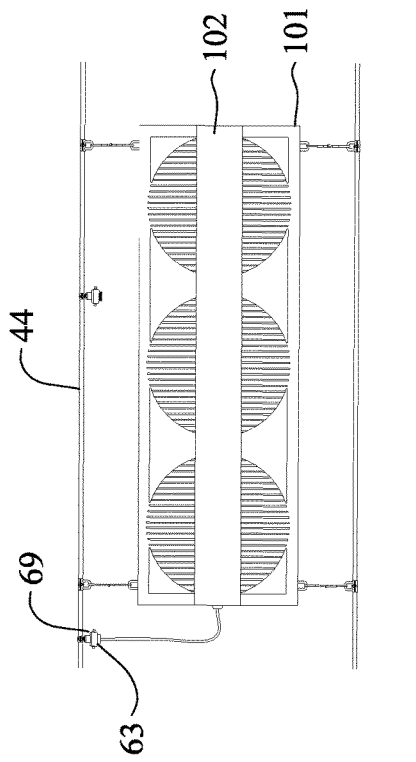
FIG. 3d shows a back elevation of an automated, self-powered, quick to install roadway intersection signaling device according to an embodiment.
Figure 3C:
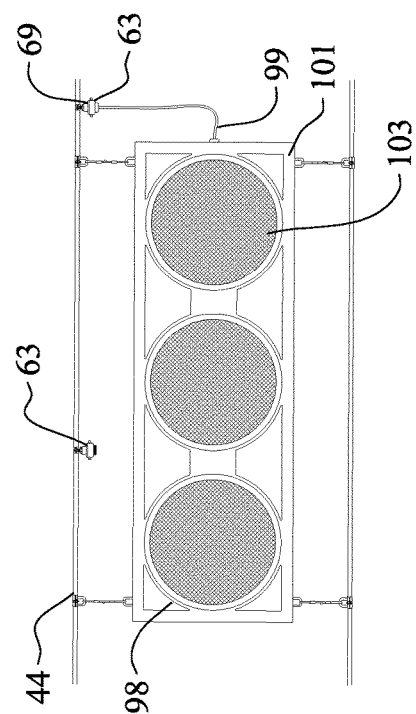
FIG. 3c shows a frontal elevation of an automated, self-powered, quick to install roadway intersection signaling device according to an embodiment.

FIG. 3c shows a front elevation of the signaling device 92. The signaling device 92 is shown coupled by fastening devices 97 to the top and bottom mechanical support cables 44 and electrically coupled by cord and plug 99 to the power or power and data cable 23, suspended below the top mechanical cable support 44. Elements shown include the frame 101, visor 98, light source panel 103, and portions of the back power strip 102.

FIG. 3d shows the back elevation of the signaling device 92. This view shows the entire power strip 102 panel. The panel can include a microprocessor, resident program with memory, and a transceiver. It can also include a resident backup power unit. Above and below the power strip 102 panel, heat dissipating fins 100 are shown coupled to the back side of the light source panel 103. Both FIGS. 3c and 3d show voided openings between the light source panel 103 and the signaling device frame 101. The voided openings further reduce the wind load on the signaling device 92 assembly.

FIG. 3e shows a frontal perspective of the signaling device 92. The signaling device 92 is shown coupled to the top and bottom suspended mechanical support cables 44 and is electrified by power delivered through the power or power and data cable 23. Elements shown include: visor 98, light source panel 103, frame 101, and cord and plug 99.

FIGS. 4a-4c show a photovoltaic panel 91 embodiment coupled to the suspended top and bottom support cables 44 and the power or power and data cable 23.

FIG. 4a shows an elevation of the photovoltaic panel 91 short side. The panel's form is typically square or rectangular, having photovoltaic cells 105 on its top surface and a power management strip 106 on its bottom surface. In this embodiment, the panel 91 is positioned horizontally in between the top and bottom support cables 44. Cables/chains 110 coupled to the top and bottom support cables and to the top and bottom corners of a panel 91 secure the panel in position. This embodiment shows the photovoltaic panel 91 restrained in position by aircraft cable 110. The profile of the panel is slimline, having in one embodiment rounded surfaces to minimize the area contact with prevailing winds, thus reducing the stress on the suspended cables embodiment. The panel frame is made of lightweight rigid and weather resistant material that can withstand constant vibrations. Power generated by the photovoltaic panel 91 is conveyed by the cord and plug 99 to the power conductors cable 23. From there the power can be directly conveyed to a selected device and/or conveyed to the assembly's power storage device 79.

FIG. 4b shows the top elevation of the photovoltaic panel 91. On the panel 91 an array of 21 each photovoltaic cells 105 are shown, configured in three rows, each having 7 cells 105. At the bottom and top of the panel's frame 101 corners, coupled fastening devices 97 connect to adjustable rigid fasteners 104 and/or cable/chain 110 that when coupled to the top and bottom suspended mechanical support cables 44, restrain the photovoltaic panel 91 in position. Across the longitudinal face of the photovoltaic panel 91 and suspended above, the power or power and data conductors cable 23 is shown with power or power and data hubs 69 coupled to the conductors cable 23.

FIG. 4c shows the bottom face of the photovoltaic panel 91. Coupled to the panel's 91 longitudinal center, a power strip 106 can retain at least one of: a power management device, a power storage device, a processor with or without a microswitch, resident code with memory, and a wireless communication device. The bottom suspended mechanical support cable 44 is also shown below the longitudinal center of the power strip 106. The photovoltaic panel 91 is secured in position by having adjustable, rigid fasteners 104 and/or chains/cables 110 coupled to the panel's 91 top and bottom frame and top and bottom mechanical support cables 44.

FIGS. 5a and 5b show elevational views of the hub 15 with partial sections of the power or power and data primary conductors cable 23 coupled to the suspended mechanical support cable 44.

FIG. 5a shows a longitudinal view of the power or power and data primary conductors cable 23 coupled to a hub 15, cord and plug 99 cable (not shown) having a threaded hub coupler coupled to the hub's 15 threaded receptacle 112. A gasket disposed inside the threaded receptacle coupler prevents moisture entry when the receptacle is coupled to the hub's threaded receptacle 112. In this embodiment, markings shown on the exterior wall of the hub 15 designate one example of a means to select the cord and plug cable 99 circuit. This means involves aligning the selected circuit number on the hub 15 with the corresponding number on the cable's plug, and then securing the assembly using the cord and plug 99 threaded coupler. In another embodiment (not shown), a lever or switching device can be built into the hub 15 to enable circuit selection. The present embodiment of the hub 15 can flow power or power and data to a device through the coupled cord and plug 99 cable. Power or power and data can also flow from the device through the hub to another neighboring device, a power storage device, or a combination thereof. This figure shows the data or data and power primary conductors 23 and the hub 15 positioned parallel to the suspended mechanical support cable 44 with a cable hanging loop coupler 30 connecting the hub 15 to the suspended mechanical support cable 44. In this embodiment, the coupler 30 is shown embracing the mechanical support cable 44 by employing top and bottom "U" shaped elements. The bottom "U" shaped element employs a threaded bolt that engages a threaded bore at the top of the conductor's hub 15 and is secured to the top "U" shaped element by two bolts located opposite to the cable 44 on the "U" shaped elements' flat ends. The hub's coupler 30 can couple devices that are powered or non-powered. Non-powered devices coupled to the hub 15 provide the means to maintain power or power and data conductors cable 23 tension. Such assemblies employ caps to cover a hub's 15 threaded receptacle 112 (not shown).

FIG. 5b shows a transverse view of the power or power and data primary conductors cable 23 coupled to a hub 15, cord and plug 99 cable (not shown) having a threaded hub coupler coupled to the hub's 15 threaded receptacle 112. A gasket disposed inside the threaded receptacle coupler prevents moisture entry when the receptacle is coupled to the hub's threaded receptacle 112. In this embodiment, markings shown on the exterior wall of the hub 15 designate one example of a means to select the cord and plug cable 99 circuit. This means involves aligning the selected circuit number on the hub 15 with the corresponding number on the cable's plug, and then securing the assembly using the cord and plug 99 threaded coupler. In another embodiment (not shown), a lever or switching device can be built into the hub 15 to enable circuit selection. The present embodiment of the hub 15 can flow power or power and data to a device through the coupled cord and plug 99 cable. Power or power and data can also flow from the device through the hub to another neighboring device, a power storage device, or a combination thereof. This figure shows the data or data and power primary conductors 23 and the hub 15 positioned parallel to the suspended mechanical support cable 44 with a cable hanging loop 30 coupler connecting the hub 15 to the suspended mechanical support cable 44. In this embodiment, the coupler 30 is shown embracing the mechanical support cable 44 by employing top and bottom "U" shaped elements. The bottom "U" shaped element employs a threaded bolt that engages a threaded bore at the top of the conductor's hub 15 and is secured to the top "U" shaped element by two bolts located opposite to the cable 44 on the "U" shaped elements' flat ends. The hub's coupler 30 can couple devices that are powered or non-powered. Non-powered devices coupled to the hub 15 provide the means to maintain power or power and data conductors cable 23 tension. Such assemblies employ caps to cover a hub's 15 threaded receptacle 112 (not shown).

The embodiments and examples set forth herein were presented in order to best explain the present invention and its practical application and to thereby enable those of ordinary skill in the art to make and use the invention. However, those of ordinary skill in the art will recognize that the foregoing description and examples have been presented for the purposes of illustration and example only. The description as set forth is not intended to be exhaustive or to limit the invention to the precise form disclosed. Many modifications and variations are possible in light of the teachings above without departing from the spirit and scope of the forthcoming claims.

The invention claimed is:

1. A self-powered cable-suspended traffic signaling system comprising:
    a plurality of vertical support structures;
    a conductor cable having a plurality of hubs coupled to and spaced apart along the conductor cable;
    a mechanical support cable extending between at least two of the plurality of vertical support structures, the mechanical support cable being mechanically coupled to the conductor cable;
    a power generating device;
    a power storage device;
    a processor with resident memory and code;
    a sensing device; and
    a signaling device coupled to receive power or power and data from at least one of the power generating device and the power storage device,
    wherein at least one of a power consuming electrical device and the power generating device is detachably coupled to a power or power and data receptacle of one of the plurality of hubs.

2. The system of claim 1, wherein the signaling device receives power from an external source.

3. The system of claim 1, wherein the processor receives input from at least one of the sensing devices and prioritizes the operation of the signaling device based on the input.

4. The system of claim 1, further comprising a wireless communication device coupled to at least one of: the processor, a cable mounted device, and a remote device in the proximity of said system.

5. The system of claim 1, further comprising a detachable device cord and plug connector that connects to at least one of the plurality of power or power and data hub receptacles.

6. The system of claim 5, wherein at least one of the detachable cord and plug connector and the hub receptacle enables selecting a power circuit, a data circuit, or a power and data circuit.

7. The system of claim 1, wherein the power generating device comprises at least one of a wind driven power generating device, a photovoltaic cell-based power generating device, and/or a fuel cell-based power generating device.

8. The system of claim 1, wherein at least one of the power generating device, the power storage device, the sensing power generating device, and the signaling device employs at least one of a transceiver, a processor with memory and code, and a controller.

9. The system of claim 1, further comprising a camera driven by artificial intelligence (AI) code and coupled to the mechanical support cable, where the camera employs image correction algorithms and/or a gyroscopic device to maintain image clarity.

10. The system of claim 1, wherein the power consuming electrical device is a camera, and wherein the camera is powered using energy from one of the power generating device and the power storage device.

11. The system of claim 1, wherein the conductor cable employs a plurality of differently configured detachable hub connectors to provide power or power and data to the devices coupled to the conductor cable.

* * * * *